United States Patent
Asayama et al.

(10) Patent No.: US 7,184,733 B2
(45) Date of Patent: Feb. 27, 2007

(54) HIGH FREQUENCY RECEIVING DEVICE, INTEGRATED CIRCUIT USED FOR THE SAME, AND TV RECEIVER USING THEM

(75) Inventors: Sanae Asayama, Aichi (JP); Koji Nakatsuji, Gifu (JP); Atsuhito Terao, Gifu (JP); Yoshihide Tabata, Kyoto (JP); Hideji Takami, Shiga (JP); Masanori Suzuki, Aichi (JP); Hirochika Kashima, Aichi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 434 days.

(21) Appl. No.: 10/874,810

(22) Filed: Jun. 24, 2004

(65) Prior Publication Data

US 2005/0032492 A1    Feb. 10, 2005

(30) Foreign Application Priority Data

Jun. 24, 2003 (JP) ............................. 2003-179114
Mar. 19, 2004 (JP) ............................. 2004-079851

(51) Int. Cl.
*H04B 1/06* (2006.01)

(52) U.S. Cl. ............... 455/260; 455/168.1; 455/188.2; 455/193.2; 455/316; 455/340; 348/211.2; 348/733; 331/36 C; 331/36 L; 331/177

(58) Field of Classification Search ......... 348/211.2, 348/536, 705, 706, 725, 726, 731, 733; 331/17–19, 331/36 R, 36 C, 36 L, 117, 177; 455/150, 455/161.1, 168.1, 188.1, 188.2, 189.1, 791.1, 455/193.2, 255–260, 313–316, 337–340

See application file for complete search history.

(56) References Cited

U.S. PATENT DOCUMENTS

| 3,931,578 | A |   | 1/1976 | Gittinger |
| 5,625,325 | A |   | 4/1997 | Rotzoll et al. |
| 5,896,562 | A | * | 4/1999 | Heinonen ............ 455/76 |
| 6,091,304 | A |   | 7/2000 | Harrer |

(Continued)

FOREIGN PATENT DOCUMENTS

EP        0 797 311 A2    9/1997

(Continued)

OTHER PUBLICATIONS

Baars, Nico. "ICs and Discrete Semiconductors for TV and VCR Turners," Electronic Components and Applications, vol. 9, No. 4, pp. 240-252.

*Primary Examiner*—Edward F. Urban
*Assistant Examiner*—Nhan T. Le
(74) *Attorney, Agent, or Firm*—McDermott Will & Emery LLP

(57) ABSTRACT

An oscillation frequency changing means is inserted between a tuner and an oscillator of local oscillator (56) of a high frequency receiving device, and the oscillation frequency changing means, in each frequency band received, changes the oscillation frequency characteristic of local oscillator (56) in relation to the tuning voltage supplied from PLL circuit (78), and operates in accordance with the frequency characteristic of tuning filter (52, 54, 62, 64) to obtain an oscillation signal varied just by a predetermined frequency, thereby making it possible to receive broadband channels of continuous VHF broadcast band and UHF broadcast band.

43 Claims, 9 Drawing Sheets

U.S. PATENT DOCUMENTS

| | | | |
|---|---|---|---|
| 6,125,269 A * | 9/2000 | Brekelmans | 455/180.1 |
| 6,215,988 B1 * | 4/2001 | Matero | 455/188.1 |
| 6,438,361 B1 | 8/2002 | Chong et al. | |
| 6,731,349 B1 * | 5/2004 | Van Der Wijst | 348/732 |
| 2001/0036838 A1 * | 11/2001 | Higuchi | 455/552 |
| 2002/0190806 A1 | 12/2002 | Hong et al. | |

FOREIGN PATENT DOCUMENTS

| | | |
|---|---|---|
| EP | 1 189 347 A1 | 3/2002 |
| EP | 1 195 899 A2 | 7/2002 |
| EP | 1 244 215 A1 | 9/2002 |
| JP | 1-265688 | 10/1989 |
| JP | 2000-165277 A | 6/2000 |
| JP | 2000-295539 A | 10/2000 |
| JP | 2002-118795 A | 4/2002 |
| WO | WO 02/101947 A1 | 12/2002 |

* cited by examiner

HIGH FREQUENCY RECEIVING DEVICE, INTEGRATED CIRCUIT USED FOR THE SAME, AND TV RECEIVER USING THEM

BACKGROUND OF THE INVENTION

1. Field of the Invention

The present invention relates to a high frequency receiving device used for a TV receiving tuner or the like, and an integrated circuit used for the same.

2. Description of the Related Art

A conventional high frequency receiving device will be described in the following with reference to the drawings. FIG. 8 is a block diagram of a conventional high frequency receiving device.

In FIG. 8, a high frequency signal ranging from 55.25 MHz to 801.25 MHz is inputted to input terminal 1. The high frequency signal is fed to single tuning filter 2 that is a single tuning type filter. The single tuning filter 2 includes one variable capacity diode and is able to vary the tuning frequency by using a tuning voltage applied to frequency variable terminal 2a. The tuning frequency of single tuning filter 2 is within the range of UHF broadcast band (367.25 MHz to 801.25 MHz).

The output of single tuning filter 2 is connected to high frequency amplifier 3, and high frequency amplifier 3 amplifies UHF broadcast band signals. The output of high frequency amplifier 3 is connected to double tuning filter 4. The double tuning filter 4 includes two variable capacity diodes and is able to vary the tuning frequency by using a tuning voltage applied to frequency variable terminal 4a.

The output signal of double tuning filter 4 is inputted to one side of mixer 5, and a local oscillation signal produced by dividing the local oscillation output signal of local oscillator 6 by means of frequency divider 7 is inputted to the other side thereof. The mixer 5 mixes UHF broadcast band signal having passed through double tuning filter 4 with the local oscillation signal, and converts it to intermediate frequency signal 45.75 MHz. The output of mixer 5 is connected to intermediate frequency filter 8, and unnecessary signal is attenuated by occupied frequency band 6 MHz. The output signal of intermediate frequency filter 8 is supplied to output terminal 9 via the intermediate frequency amplifier.

And these single tuning filter 2, high frequency amplifier 3, double tuning filter 4, mixer 5 and intermediate frequency filter 8 configure UHF signal receiver 10.

Also, VHF band signal is supplied to input terminal 1. VHF signal receiver 11 receives VHF broadcast band signals ranging from 55.25 MHz to 361.25 MHz. The VHF signal receiver 11 comprises single tuning filter 12, high frequency amplifier 13, double tuning filter 14, and mixer 15.

First, single tuning filter 12 includes one variable capacity diode, and is able to vary the tuning signal by using the tuning voltage applied to frequency variable terminal 12a. The output of single tuning filter 12 is connected to high frequency amplifier 13, and high frequency amplifier 13 amplifies the VHF broadcast band signals.

The output of high frequency amplifier 13 is connected to double tuning filter 14. The double tuning filter 14 includes two variable capacity diodes, and is able to vary the tuning frequency by using the tuning voltage applied to frequency variable terminal 14a. The output signal of double tuning filter 14 is inputted to one side of mixer 15, and local oscillation signal produced by dividing the local oscillation output signal of local oscillator 6 by means of frequency divider 16 is inputted to the other side thereof. The mixer 15 mixes VHF broadcast band signal having passed through double tuning filter 14 with the local oscillation signal, and converts it to intermediate frequency signal 45.75 MHz. And, the output of mixer 15 is connected to the input of intermediate frequency filter 8.

Next, at local oscillator 6, oscillator 17 produces local oscillation output signals. Tuner 18 is connected to input 17a and 17b of oscillator 17. The tuner 18 comprises series connection body 21 with variable capacity diode 19 and capacitor 20, and inductor 22 parallel-connected to series connection body 21.

PLL circuit 23 is a PLL circuit which produces control voltage for frequency control, and the output of oscillator 17 is connected to the input of PLL circuit 23. And, the tuning voltage, control voltage outputted from output terminal 23a of PLL circuit 23, is supplied to variable capacity diode 19 of tuner 18, and variable capacity diodes of single tuning filter 2, double tuning filter 4, single tuning filter 12, and double tuning filter 14.

Next, the operation of local oscillator 6 and frequency divider 7, 16 in a conventional high frequency receiving device will be described with reference to FIG. 9. FIG. 9 is a characteristic diagram of a local oscillator, and horizontal axis 31 stands for local oscillation frequency (MHz) applied to mixer 5 or 15, and vertical axis 32 is tuning voltage (V) outputted from PLL circuit 23.

In FIG. 9, curve 33 shows the characteristic of local oscillation signal supplied to mixer 5 of UHF signal receiver 10. It is configured in that oscillation signals of about 350 MHz and about 850 MHz can be obtained respectively when the tuning voltage of PLL circuit 23 is 1V and 24V in UHF broadcast signal receiving mode.

Curve 34 shows the characteristic of local oscillation signal supplied to mixer 15 during reception of VHF high-band broadcast band signals in a conventional high frequency receiving device which divides the output frequency of local oscillator 6 by frequency divider 16 as it is. Also, curve 35 shows the characteristic of local oscillation signal suited for receiving VHF high-band broadcast band signals.

Curve 36 shows the characteristic of local oscillation signal supplied to mixer 15 during reception of VHF low-band broadcast band signals in a conventional high frequency receiving device which divides the output frequency of local oscillator 6 by frequency divider 16 as it is. Also, curve 37 shows the characteristic of local oscillation signal suited for receiving VHF low-band broadcast band signals.

As prior art document information related to this invention, for example, Japanese Laid-open Patent 2000-295539, Japanese Laid-open Patent 2002-118795, or Japanese Laid-open Patent H1-265688 is well-known.

However, in such a conventional high frequency receiving device, there arises a subject such that within the tuning voltage variable range there is a frequency range that cannot be oscillated, and a certain frequency range cannot be received. That is, as shown in FIG. 9, when receiving VHF high-band broadcast band signals, the local oscillation signal characteristic has to be originally as shown by curve 35. However, in case a local oscillation output signal shown by curve 33 is divided by frequency divider 16 as it is, the characteristic of frequency dividing signal supplied to mixer 15 or the local oscillation signal will be as shown by curve 34, and within the variable range of tuning voltage, there exists a frequency range that cannot be oscillated with respect to the frequency range essentially needed.

SUMMARY OF THE INVENTION

The present invention is intended to solve such conventional subjects, and the object is to provide a high frequency receiving device capable of receiving broad-band channels in a continuous range of VHF broadcast band and UHF broadcast band.

In order to achieve the purpose, the high frequency receiving device of the present invention is configured in that high frequency signals of the first frequency band and of the second frequency band lower than the first frequency band are inputted, and a desired receiving channel signal is extracted from the high frequency signal by an amplifier including a tuning circuit, and the extracted signal is mixed with the local oscillation signal produced by using the local oscillation output signal outputted from the local oscillator, thereby converting the signal to an intermediate frequency signal that is a constant frequency to be outputted, wherein the local oscillation signal is produced by dividing the local oscillation output signal by a predetermined ratio.

Also, the local oscillator comprises an oscillator, a tuner connected to the oscillator, and an oscillation frequency changing means inserted between the tuner and the oscillator.

Further, the tuner comprises a series connection body with oscillation variable capacity diode and first capacitor, and an inductor parallel-connected to the series connection body. Also, PLL circuit supplies tuning voltage to each variable capacity diode included in the tuning circuit of amplifier and to the oscillation variable capacity diode of the local oscillator.

And, the oscillation frequency changing means, in each receiving frequency band, slightly changes the oscillation frequency characteristic of the local oscillator in relation to the tuning voltage supplied from the PLL circuit, and when receiving the first frequency band, it operates in accordance with the frequency characteristic of the first tuning filter, and also, when receiving the second frequency band, it operates in accordance with the frequency characteristic of the second tuning filter, thereby obtaining a local oscillation signal varied just by a predetermined frequency.

Further, the oscillation frequency changing means includes a capacity component capable of selectively changing over parallel connection/non-connection to the oscillation variable capacity diode, a capacity component capable of selectively changing over parallel connection/non-connection to the first capacitor, and selectively makes the parallel connection of the respective capacity components in accordance with the frequency band received.

Thus, for example, when receiving the second frequency band, the oscillation frequency characteristic of the local oscillator is slightly changed by the oscillation frequency changing means, and thereby, it becomes possible to attain such operation as to obtain a local oscillation signal of a frequency range corresponding to the second frequency band such as widening the oscillation frequency range. Further, the frequency divider and the oscillation frequency changing means are properly changed over, and thereby, it is also possible to produce a local oscillation signal of a frequency that is continuous in a range from VHF to UHF, and all channels can be received even when they are continuous between the first receiving band and the second receiving band. Accordingly, in TV broadcast, it is possible to realize a high frequency receiving device capable of receiving broad-band channels of continuous VHF broadcast band and UHF broadcast band.

DESCRIPTION OF THE PREFFERRED EMBODIMENTS (First Preferred Embodiment)

Figure 1:
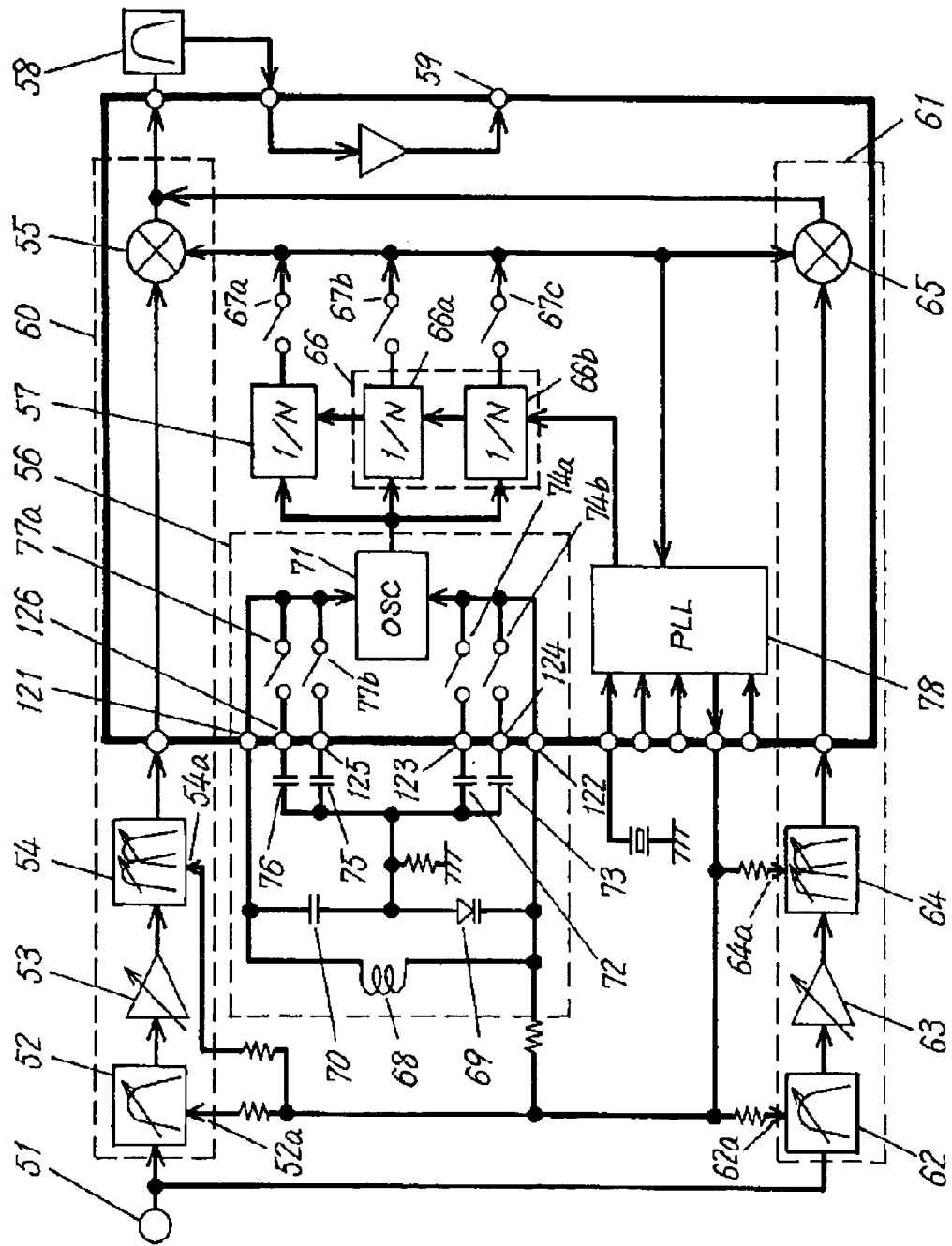
FIG. 1 is a block diagram of a high frequency receiving device in the first preferred embodiment of the present invention.

The first preferred embodiment of the present invention will be described in the following with reference to the drawings. FIG. 1 is a block diagram of a high frequency receiving device in the first preferred embodiment.

In FIG. 1, a high frequency signal ranging from 55.25 MHz to 801.25 MHz is inputted to input terminal 51. The high frequency signal is fed to single tuning filter 52. The single tuning filter 52 is a single tuning filter including one variable capacity diode, and is able to vary the tuning frequency by using the tuning voltage applied to frequency variable terminal 52a. The tuning frequency of single tuning filter 52 ranges from 367.25 MHz to 801.25 MHz of UHF broadcast band.

The output of single tuning filter 52 is connected to high frequency amplifier 53, and high frequency amplifier 53 amplifies the signal of UHF broadcast band. The output of high frequency amplifier 53 is connected to double tuning filter 54. The double tuning filter 54 include two variable capacity diodes and is able to vary the tuning frequency by using the tuning voltage applied to frequency variable terminal 54a.

The output signal of double tuning filter 54 is inputted to one side of mixer 55, and the local oscillation output signal of local oscillator 56 is inputted as local oscillation signal to the other side thereof through frequency divider 57. Mixer 55 mixes UHF broadcast band signal having passed through double tuning filter 54 with the frequency-divided signal of oscillation signal of local oscillator 56, that is, local oscillation signal, and converts it to intermediate frequency signal of 45.75 MHz.

The output of mixer 55 is connected to intermediate frequency filter 58, and unnecessary signal is attenuated by occupied frequency band 6 MHz. The output signal of intermediate frequency filter 58 is supplied to output terminal 59 via the intermediate frequency amplifier.

And these single tuning filter 52, high frequency amplifier 53, double tuning filter 54, mixer 55 and intermediate frequency filter 58 configure UHF signal receiver 60 as the first receiver.

Also, VHF band signal is supplied to input terminal 1. VHF signal receiver 61 as the second receiver receives VHF broadcast band signals ranging from 55.25 MHz to 361.25 MHz. The VHF signal receiver 61 comprises single tuning filter 62, high frequency amplifier 63, double tuning filter 64, and mixer 65 connected in this order.

Single tuning filter 62 is a single tuning filter including one variable capacity diode, and is able to vary the tuning frequency by using the tuning voltage applied to frequency variable terminal 62a. The output of single tuning filter 62 is connected to high frequency amplifier 63, and high frequency amplifier 63 amplifies the signal of VHF broadcast band.

The output of high frequency amplifier 63 is connected to double tuning filter 64. The double tuning filter 64 includes two variable capacity diodes, and is able to vary the tuning frequency by using the tuning voltage applied to frequency variable terminal 64a.

The output signal of double tuning filter 64 is inputted to one side of mixer 65, and the local oscillation output signal of local oscillator 56 is inputted as local oscillation signal to the other side thereof through frequency divider 66. Here, mixer 65 mixes VHF broadcast band signal having passed through double tuning filter 64 with the frequency-divided signal of oscillation signal of local oscillator 56, that is, local oscillation signal, and converts it to intermediate frequency signal of 45.75 MHz. And, the output of mixer 65 is connected to the input of intermediate frequency filter 58.

Frequency divider 66 includes frequency divider 66a for receiving VHF low-band broadcast band and frequency divider 66b for receiving VHF high-band broadcast band. Also, as shown in FIG. 1, changeover switches 67a, 67b, 67c for changing over frequency dividers 57, 66a, 66b are connected as local oscillation selectors for selecting a local oscillation signal of frequency corresponding to the receiving frequency band between these frequency dividers 57, 66 and the other inputs of mixers 55 and 65.

Next, local oscillator 56 comprises a tuner including a series connection body with variable capacity diode 69 as an oscillation variable capacity diode and capacitor 70 as a first capacitor and inductor 68 parallel-connected to the series connection body, oscillator 71 connected to both ends of the series connection body, and an oscillation frequency changing means connected to the tuner.

And the oscillation frequency changing means comprises capacitor 72 and capacitor 73 which can be connected in parallel with variable capacity diode 69; changeover switches 74a, 74b as capacity variable means respectively connected to these capacitors 72, 73; capacitor 75 and capacitor 76 which can be connected in parallel with capacitor 70; and changeover switches 77b, 77a as capacity variable means respectively connected to these capacitors 75, 76.

In this way, capacitor 72 and capacitor 73 can be selected by changeover switch 74, and also, capacitor 75 and capacitor 76 can be selected by changeover switch 77.

That is, the oscillation frequency changing means includes capacitors 72, 73 capable of selectively changing over parallel connection/non-connection to variable capacity diode 69, and capacitors 75, 76 capable of selectively changing over parallel connection/non-connection to capacitor 70, and is able to selectively make parallel connection of the capacitor to each of variable capacity diode 69 and capacitor 70 by means of changeover switches 74, 77.

Accordingly, in the first preferred embodiment, by operating these changeover switches 74, 77, it is possible to vary the capacity value inserted in series to oscillation variable capacity diode 69 and the capacity value inserted in parallel to oscillation variable capacity diode 69, and therefore, the tuning frequency at the tuner is varied, enabling fine variation of the oscillation frequency of the local oscillator.

Also, since the variable capacity diode is connected in series to inductor 68, it enables broad band oscillation.

PLL circuit 78 is a PLL (Phase Lock Loop) circuit that produces control voltage for executing frequency control, and the local oscillation signal that is oscillation signal of local oscillator 56, frequency-divided by frequency divider 57 or 66, is supplied to the input of PLL circuit 78. And PLL circuit 78 applies a tuning voltage to variable capacity diodes 82, 84, 86, 89, 96, 98, 102, 107 (FIG. 2, FIG. 3) of single tuning filter 52, double tuning filter 54, single tuning filter 62 and double tuning filter 64, and oscillation variable capacity diode 69.

Figure 2:
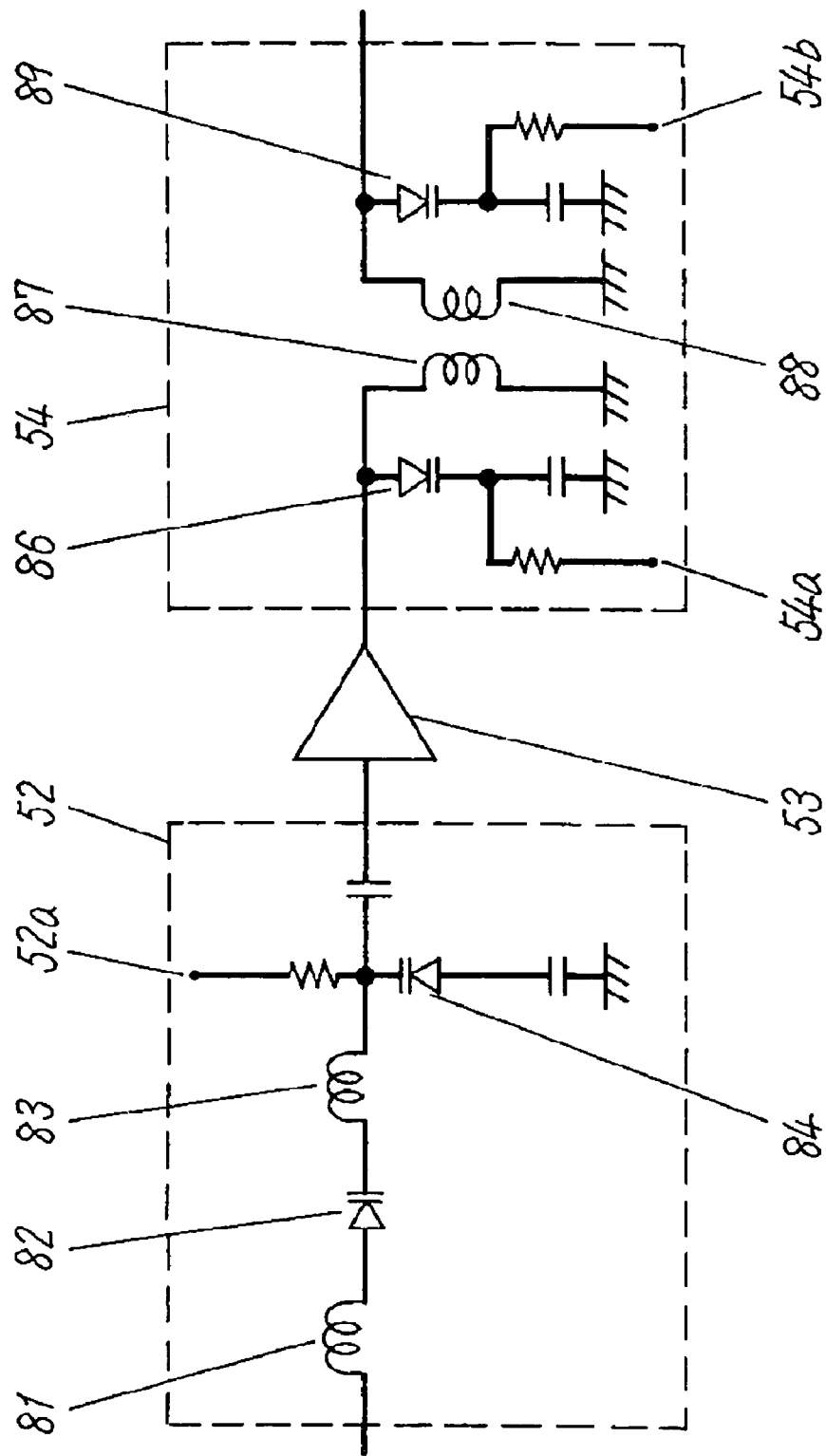
FIG. 2 is a circuit diagram of a tuning filter for receiving UHF band of the first preferred embodiment.

FIG. 2 is circuit diagrams of single tuning filter 52 and double tuning filter 54 in UHF signal receiver 60 in the first preferred embodiment. Single tuning filter 52 and double tuning filter 54 in the first preferred embodiment will be described in the following with reference to the drawings.

First, single tuning filter 52 is described. In FIG. 2, variable capacity diode 82 is connected in series to inductor 81, and one side of inductor 83 is connected to the cathode side of variable capacity diode 82. The other side of inductor 83 is connected to the cathode side of variable capacity diode 84, and the anode side thereof is grounded via capacitor. Here, reference numeral 52a is a frequency variable terminal, and it is connected to the cathode side of variable capacity diode 82, 84 via resistor, to which tuning voltage is supplied from the output of PLL circuit 78.

And, these inductor 81, variable capacity diode 82, inductor 83 and variable capacity diode 84 configure single tuning filter 52. In this single tuning filter 52, the tuning frequency can be changed by changing the capacities of both variable capacity diodes 82 and 84 in accordance with the tuning voltage supplied to frequency variable terminal 52a. In this preferred embodiment, single tuning filter 52 is of filter constant that allows UHF band signal passing.

Next, double tuning filter 54 is described. Double tuning filter 54 comprises variable capacity diode 86, inductor 87 connected in parallel to the variable capacity diode 86, inductor 88 coupled in mutually inducing fashion to the inductor 87, and variable capacity diode 89 connected in parallel to the inductor 88. Reference numerals 54a and 54b are frequency variable terminals, which are respectively connected to the cathode sides of variable capacity diode 86 and variable capacity diode 89, to which tuning voltage is supplied from the output of PLL circuit 78.

And, in double tuning filter 54, the tuning frequency can be changed by changing the capacities of variable capacity diodes 86 and 89 in accordance with the tuning voltage applied to frequency variable terminals 54a and 54b.

Figure 3:
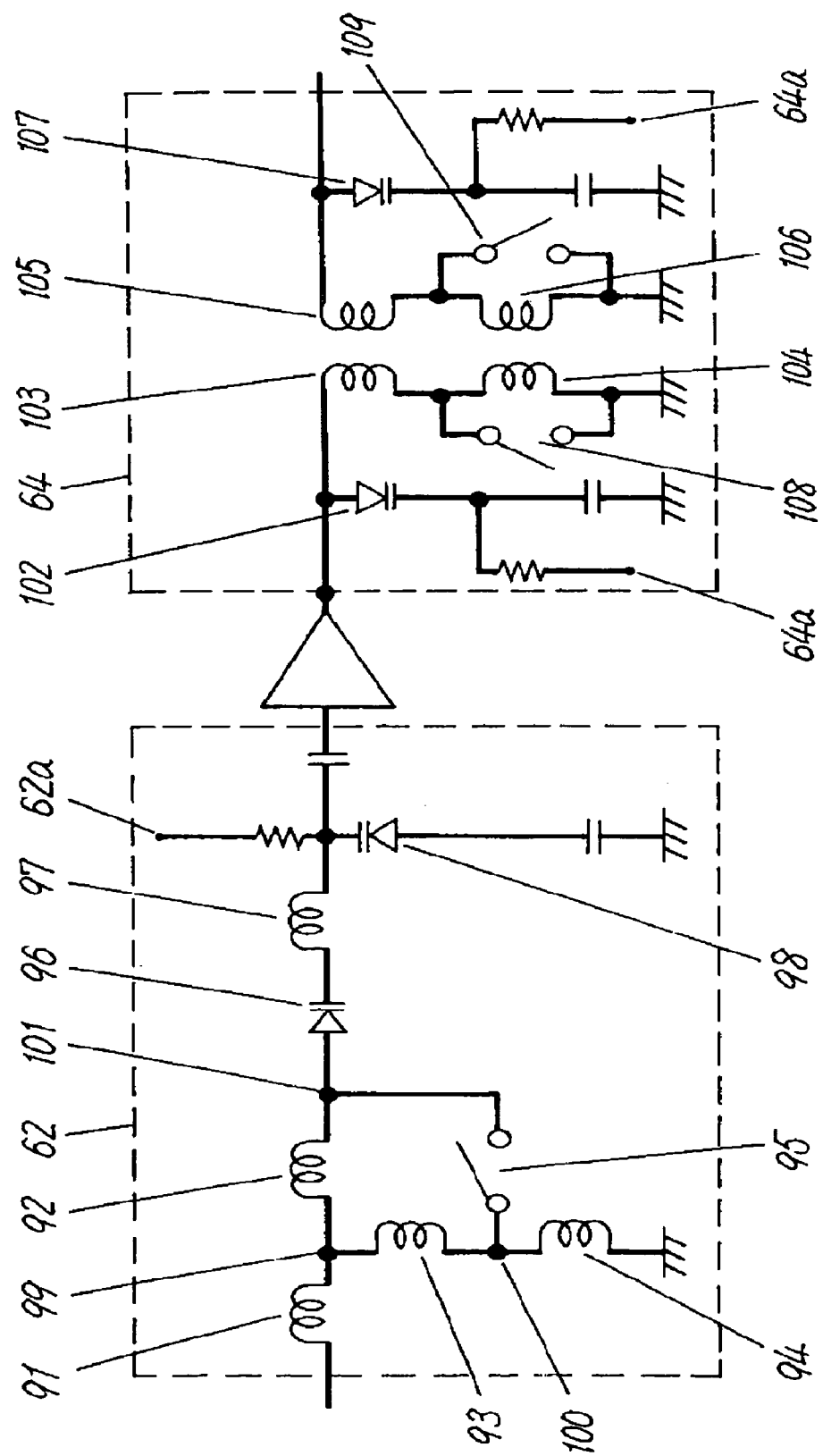
FIG. 3 is a circuit diagram of a tuning filter for receiving VHF band of the first preferred embodiment.

FIG. 3 is circuit diagrams of single tuning filter 62 and double tuning filter 64 in VHF signal receiver 61 in the first preferred embodiment. Single tuning filter 62 and double tuning filter 64 will be described in the following with reference to FIG. 3.

In FIG. 3, single tuning filter 62 comprises inductor 91, inductor 92, inductor 93 and inductor 94, and switch 95, variable capacity diode 96, inductor 97, and variable capacity diode 98. Also, inductor 91 and inductor 92 are series-connected to each other, and between the connection 99 and ground are series-connected inductor 93 and inductor 94. And switch 95 is inserted between connection 100 of inductor 93 and inductor 94 and connection 101 of inductor 92 and the anode side of variable capacity diode 96. On the other hand, one side of inductor 97 is connected to the cathode side of variable capacity diode 96, and between the other side of inductor 97 and ground is connected variable capacity diode 98.

Reference numeral 62a is a frequency variable terminal, and it is connected to the cathode side of variable capacity diode 98 via resistor, to which tuning voltage is supplied from the output of PLL circuit 78. And, in the single tuning filter 62, the capacities of variable capacity diodes 98 and 96 are varied according to the tuning voltage applied to frequency variable terminals 62a, thereby changing the tuning frequency. In this preferred embodiment, single tuning filter 62 is of filter constant that allows VHF band signal passing.

Next, double tuning filter 64 comprises variable capacity diode 102 inserted between input and ground, series connection body with inductors 103 and 104 connected in parallel to the variable capacity diode 102, and switch 108 connected in parallel to inductor 104. And inductors 105, 106 are series-connected to each other so as to be coupled in inducing fashion to inductors 103, 104, and variable capacity diode 107 is connected in parallel to the series connection body with inductors 105 and 106.

Reference numerals 64a are frequency variable terminals and respectively connected to the cathode sides of variable capacity diodes 102 and 107 via resistor, to which tuning voltage is supplied from PLL circuit 78. And, in the double tuning filter 64, the tuning frequency can be varied by changing the capacities of variable capacity diodes 102 and 107 in accordance with the tuning voltage applied to frequency variable terminals 64a. Also, switches 95, 108, 109 are used for changing over VHF high-band and low-band.

Next, as to a high frequency receiving device in the first preferred embodiment, an example of receiving TV broadcast having UHF broadcast band as the first frequency band and VHF broadcast band as the second frequency band continuously arranged below the UHF broadcast band is explained in the following.

Table 1 is a table showing a state of each changeover switch when receiving each broadcast band.

switch 67b is turned ON so that the output of frequency divider 66a is connected, and switches 95, 108 and 109 are turned ON.

And, when receiving VHF low-band broadcast band, switch 74a and switch 77a are turned OFF, while switches 74b and 77b are turned ON. Also, as for switch 67, switch 67c is turned ON so that the output of frequency divider 66b is connected, and switches 95, 108 and 109 are turned OFF.

As for high frequency amplifiers 53, 63, when receiving UHF broadcast band, high frequency amplifier 53 is turned ON, and when receiving VHF broadcast band, high frequency amplifier 63 is turned ON. The purpose of this is that the high frequency signal having passed through single tuning filter 52 or 62 is not supplied to the other mixer 55 or 65 when the high frequency amplifier at the non-receiving side is turned OFF. In this way, only the signal desired to be received of the high frequency signal is converted to intermediate frequency signal.

In the first preferred embodiment of the present invention, inductor 68 of local oscillator 56 is 20 nH, capacitor 70 is 22 pF, and the variable capacity diode used is variable capacity diode 69 that can be varied in a range from 31 pF to 2.7 pF at 2V to 25V.

Local oscillator 56 thus configured oscillates frequencies ranging from 350 MHz to 850 MHz when receiving UHF broadcast band, and oscillates frequencies ranging from 358 MHz to 814 MHz when receiving VHF high-band broadcast band, and oscillates frequencies ranging from 404 MHz to 692 MHz when receiving VHF low-band broadcast band.

Further, when receiving UHF broadcast band, the oscillation signal of local oscillator 56 is frequency-divided to 1/1 by frequency divider 57 and supplied to mixer 55, thereby obtaining 45.75 MHz intermediate frequency signal. On the other hand, when receiving VHF high-band broadcast band, the oscillation signal of local oscillator 56 is frequency-divided to 1/2 by frequency divider 66a and supplied to mixer 65, thereby obtaining 45.75 MHz intermediate frequency signal. Finally, in broadcast of NTSC system, when receiving VHF low-band broadcast band, the oscillation signal of local oscillator 56 is frequency-divided to 1/4 by frequency divider 66b and supplied to mixer 65, thereby obtaining 45.75 MHz intermediate frequency.

Thus, local oscillation signal in a range of frequency corresponding to each broadcast band can be produced by

TABLE 1

| Band | Local oscillating frequency (MHz) | 74b | 74a | 77b | 77a | 67c | 67b | 67a | 95 108 109 | High frequency amplifier |
|---|---|---|---|---|---|---|---|---|---|---|
| VHF-L | 101~173 | ON | OFF | ON | OFF | ON | OFF | OFF | OFF | 63 ON<br>53 OFF |
| VHF-H | 179~407 | OFF | ON | OFF | ON | OFF | ON | OFF | ON | 63 ON<br>53 OFF |
| UHF | 413~847 | OFF | OFF | OFF | OFF | OFF | OFF | ON | — | 63 OFF<br>53 ON |

As shown in Table 1, when receiving UHF broadcast band, switches 74a, 74b, and switches 77a, 77b are turned OFF, and as for switch 67, switch 67a is turned ON so that the output of frequency divider 57 is connected.

Next, when receiving VHF high-band broadcast band, switch 74a and switch 77a are turned ON, while switch 74b and switch 77b are turned OFF. Also, as for switch 67, properly executing the changeover with respect to the frequency dividing ratio of the frequency divider and the oscillation frequency changing means.

In the first preferred embodiment, all frequency dividers 57, 66a, 66b include a program counter, and PLL circuit delivers data for setting the value of frequency dividing ratio to the program counters of frequency dividers 57, 66a, 66b in accordance with the receiving channel. Thus, for example, even when different broadcast signals such as NTSC broadcast and PAL broadcast are received, only changing the value of frequency dividing ratio of the program counter is just enough to cope with the situation.

As in the first preferred embodiment, when the frequency dividing ratio of frequency divider 57 is 1/1, there is no particular need of preparing frequency divider 57, and it is preferable to directly connect the output of local oscillator 56 to switch 67. In this case, it is possible to realize an inexpensive high frequency receiving device because there is no need of providing frequency divider 57. Further, the signal is inputted to mixer 55, not through frequency divider 57, and the loss of signal of local oscillator 56 is less. Accordingly, a high frequency receiving device of excellent C/N can be obtained.

Figure 4:
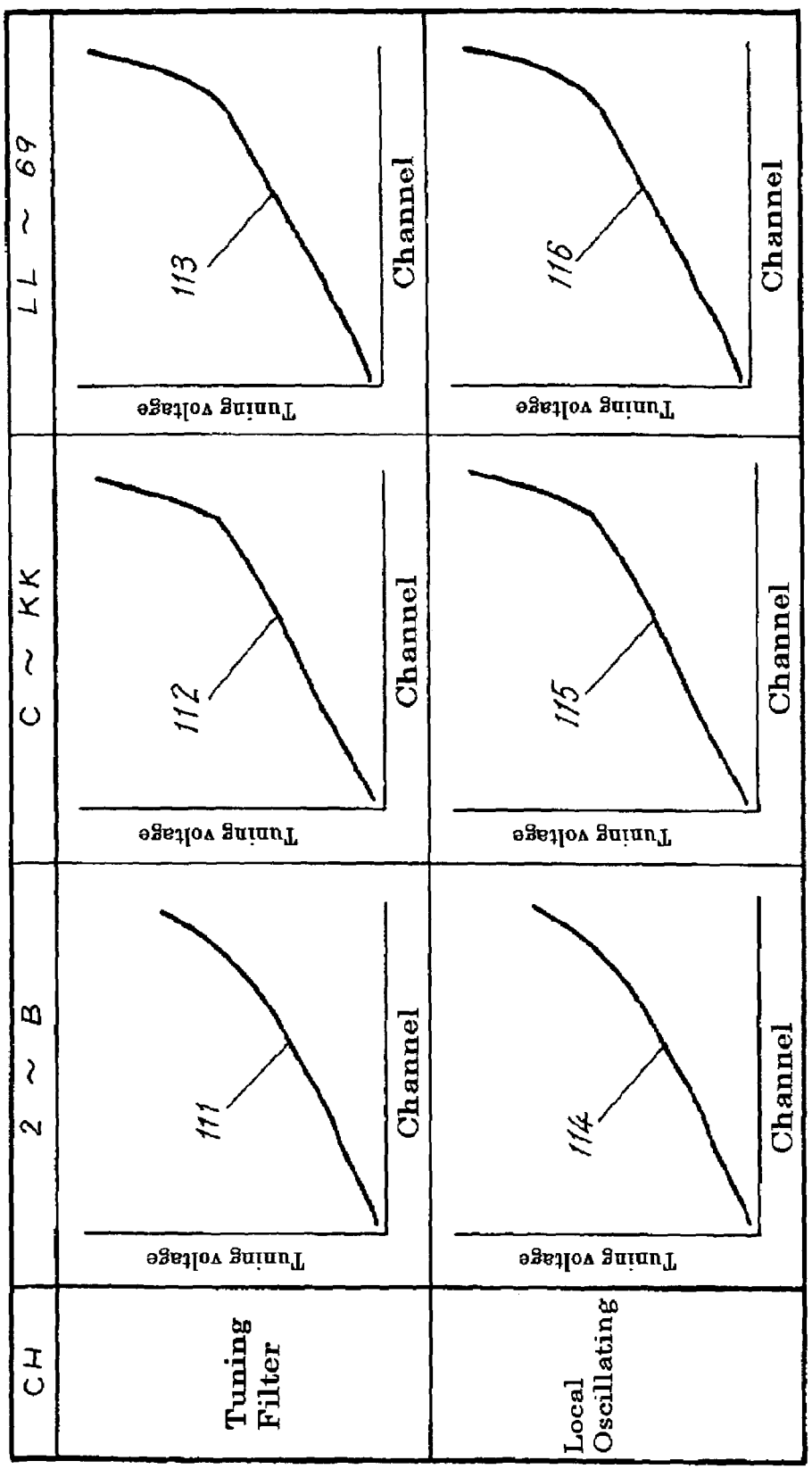
FIG. 4 is a characteristic diagram of tuning voltage in relation to the receiving channels of tuning filter and local oscillator of the first preferred embodiment.

Next, FIG. 4 shows the frequency characteristics of local oscillation signals inputted to single tuning filters 52, 62 and double tuning filters 54, 64 as tuning filters, and mixer 55 or 65 in the first preferred embodiment, in the form of characteristic chart showing receiving channel on the horizontal axis and tuning voltage on the vertical axis.

In FIG. 4, curve 111 shows the characteristic of tuning voltage in relation to receiving channel 2 channel to B channel (55.25 MHz to 127.25 MHz) in connection with single tuning filter 62 and double tuning filter 64 as tuning filters in VHF low-band broadcast band receiving mode. Similarly, curve 112 shows the characteristic of tuning voltage in relation to receiving channel C channel to KK channel (133.25 MHz to 361.25 MHz) in connection with single tuning filter 62 and double tuning filter 64 as tuning filters in VHF high-band broadcast band receiving mode. And, curve 113 shows the characteristic of tuning voltage in relation to receiving channel LL channel to 69 channel (367.25 MHz to 801.25 MHz) in connection with single tuning filter 52 and double tuning filter 54 as tuning filters in UHF broadcast band receiving mode.

Also, curve 114 shows the characteristic of tuning voltage in relation to local oscillation frequency (101 MHz to 173 MHz) corresponding to 2 channel to B channel in VHF low-band broadcast band receiving mode. Similarly, curve 115 shows the characteristic of tuning voltage in relation to local oscillation frequency (179 MHz to 407 MHz) corresponding to C channel to KK channel in VHF high-band broadcast band receiving mode. Curve 116 shows the characteristic of tuning voltage in relation to local oscillation frequency (413 MHz to 847 MHz) corresponding to LL channel to 69 channel in UHF broadcast band receiving mode.

Here, it is important to make the tuning voltage of single tuning filter 52, 62 and double tuning filter 54, 64 in each channel and the tuning voltage of local oscillator nearly equal to each other in each broadcast band. That is, it is necessary to make the tuning voltage characteristics in relation to channels of single tuning filter 52, 62 and double tuning filters 54, 64 approximate to each other in all broadcast bands. This is because for obtaining intermediate frequency signal by mixer 55, 65, it is necessary to obtain a signal always being higher by intermediate frequency by means of local oscillator 56 and the frequency divider operated in accordance with tuning frequencies of single tuning filter 52, 62 and double tuning filter 54, 64. And, this is the most important basic performance for receiving high frequency signal in a high frequency receiving device.

In this way, it is possible to receive all channels of US television continuously ranging from 55.25 MHz to 801.25 MHz in a range from VHF low-band broadcast band to UHF broadcast band.

In the first preferred embodiment of the present invention, capacitor 72, 73 and capacitor 75, 76 are changed over by switches 74 and 77 to slightly change the capacity of the tuner of local oscillator 56, thereby obtaining the local oscillation frequency characteristic in relation to the tuning voltage suited for each receiving broadcast band.

Here, when any one of capacitors 72, 73 is turned ON by operating switch 74, the capacity is inserted in parallel with oscillation variable capacity diode 69. Thus, when the capacity of oscillation variable capacity diode 69 is small, the contribution level of capacity value of oscillation variable capacity diode 69 to the oscillation frequency of local oscillator 56 becomes less. Accordingly, it is possible to change the oscillation frequency of high band in particular of local oscillator 56 at which oscillation variable capacity diode 69 is small in capacity.

Also, when any one of capacitors 75, 76 is turned ON by operating switch 77, the capacity is inserted in parallel with capacitor 70. Thus, since the capacity connected in series to oscillation variable capacity diode 69 varies in the direction of increasing, the contribution level of oscillation variable capacity diode 69 to the oscillation frequency at local oscillator 56 becomes increased, and it is possible to change the range of oscillation frequency to the tuning voltage.

Thus, by properly selecting the capacity values of these capacitors 72, 73, 75, 76, the respective characteristics of tuning voltage in relation to channel (frequency) can be independently determined in each frequency band of UHF broadcast band, VHF high-band broadcast band, and VHF low-band broadcast band.

Accordingly, by properly selecting the capacity values of these capacitors 72, 73, 75, 76, the tuning voltage characteristic in relation to the receiving channel (frequency) of local oscillator 56 in each band can be approximated to the tuning voltage characteristic in relation to the receiving channel (frequency) of single tuning filter 52, 62 and double tuning filter 54, 64. And, further, by turning switches 74, 77 ON/OFF and changing over capacitors 72, 73, 75, 76 in accordance with the frequency band received, it is possible to receive all channels of US television continuously ranging from 55.25 MHz to 801.25 MHz in a range from VHF low-band broadcast band to UHF broadcast band.

In this way, by operating switches 74, 77 of the oscillation frequency changing means, it is possible to change the contribution level to the oscillation frequency characteristics of, oscillation variable capacity diode, and therefore, the oscillation frequency characteristic can be flexibly corrected, and the oscillation frequency characteristic at local oscillator 56 can be approximated to each tuning filter, and also it is possible to set an oscillation frequency range suited for each broadcast band. That is, the oscillation frequency changing means, in each frequency band received, slightly changes the oscillation frequency characteristic of local oscillator 56 in relation to tuning voltage, and when receiving the first frequency band, it operates in accordance with the frequency characteristic of the first tuning filter, and when receiving the second frequency band, it operates in accordance with the frequency characteristic of the second tuning filter, and thereby, it is possible to obtain local oscillation signal varied just by a predetermined frequency.

In the high frequency receiving device in the first preferred embodiment, regarding all of oscillation variable capacity diode 69, variable capacity diode 84, 86, 89 (FIG.

2) and variable capacity diode 98, 102, 107 (FIG. 3), those having nearly same capacity varying characteristics are used. Thus, the tuning frequency characteristics in relation to the tuning voltage at single tuning filter 52, 62 and double tuning filter 54, 64 and the tuner at local oscillator 56 can be easily approximated to each other.

Here, these oscillation variable capacity diode 69, variable capacity diodes 84, 86, 89 (FIG. 2) and variable capacity diodes 98, 102, 107 (FIG. 3) used are those having same capacity varying ratio as that of variable capacity diode 98 necessary for changing the tuning frequency of single tuning filter 62 corresponding to VHF broadcast band.

This is because the largest capacity varying ratio is necessary for VHF band, VHF high-band in particular. Thus, the management of parts is facilitated since those with same part No. can be used for oscillation variable capacity diode 69, variable capacity diodes 84, 86, 89 (FIG. 2) and variable capacity diodes 98, 102, 107 (FIG. 3). Also, using wrong parts is hard to take place when the parts are installed.

Also, in the first preferred embodiment of the present invention, oscillator 71, switches 74, 77, frequency dividers 57, 66, mixers 55, 56, and PLL circuit 78 are integrated in one package, forming an integrated circuit. Thus, it is possible to miniaturize the high frequency receiving device.

Further, the integrated circuit includes terminals 121, 122 for connecting both ends of inductor 68, terminal 123 for connecting capacitor 72, terminal 124 for connecting capacitor 73, terminal 125 for connecting capacitor 75, and terminal 126 for connecting capacitor 76. And, between terminals 121 and 122 are arranged terminals 123, 124, 125 and 126. Also, terminal 123 and terminal 124 are disposed adjacent to terminal 122, and terminal 125 and terminal 126 are disposed adjacent to terminal 121. Thus, parts such as variable capacity diode 69, inductor 68, capacitor 70, capacitor 72, capacitor 73, capacitor 75 and capacitor 76 comprising the tuner can be connected by shortest wiring to terminal 121, terminal 122, terminal 123, terminal 124, terminal 125, terminal 126 of the integrated circuit, and it is possible to make high-quality design by reducing unnecessary capacity components and inductor components.

(Second Preferred Embodiment)

In the second preferred embodiment, UHF broadcast band and VHF broadcast band are received by using only one mixer. Accordingly, it contributes to the reduction in size and cost. The second preferred embodiment will be described in the following. Incidentally, those same as in the first preferred embodiment are given same reference numerals, and the description is simplified.

Figure 5:
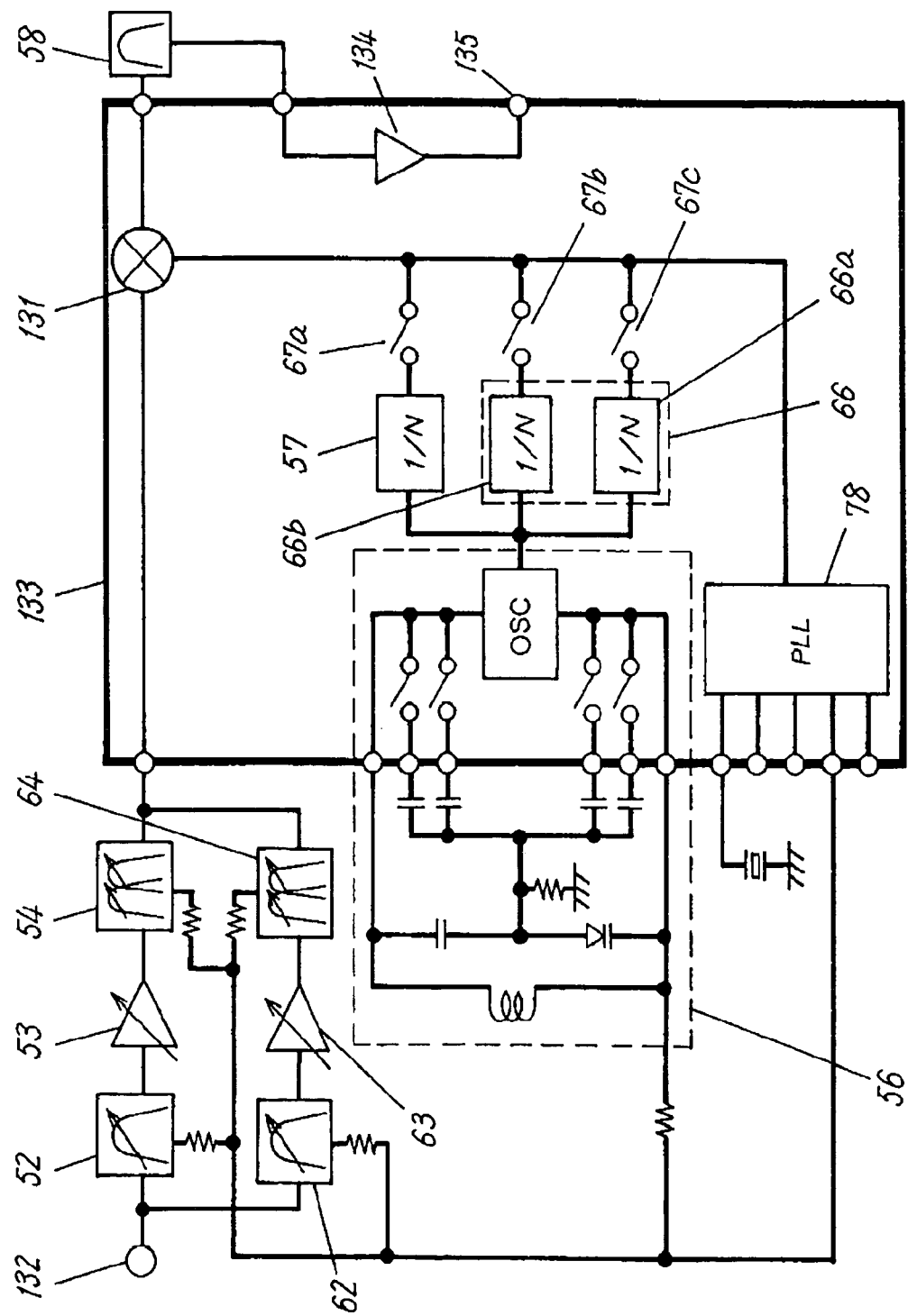
FIG. 5 is a block diagram of a high frequency receiving device in the second preferred embodiment of the present invention.

FIG. 5 is a block diagram of a high frequency receiving device in the second preferred embodiment. In FIG. 5, broadcasting waves of UHF broadcast band and VHF broadcast band are inputted to input terminal 132. And, to input terminal 132 are connected in parallel fashion, for UHF broadcast band passing, the first series connection body with single tuning filter 52, high frequency amplifier 53, and double tuning filter 54 connected in this order, and for VHF broadcast band passing, the second series connection body with single tuning filter 62, high frequency amplifier 63, and double tuning filter 64 connected in this order.

And, the output of the parallel connection body with the series connection bodies connected in parallel fashion is connected to one input of mixer 131 installed in integrated circuit 133. The output of mixer 131 is connected to output terminal 135 via intermediate frequency filter 58 and intermediate frequency amplifier 134.

On the other hand, to the other input of mixer 131 is connected the output of changeover switch 67. Also, the output of changeover switch 67 is connected to PLL circuit 78. When receiving UHF broadcast band, frequency divider 57 can be omitted. That is, the frequency ratio can be set to 1.

Also, by using only the second series connection body for VHF broadcast band passing, it is possible to realize a high frequency receiving device for VHF broadcast band only, omitting the first series connection body for UHF broadcast band passing.

The operation of the high frequency receiving device in the second preferred embodiment is same as in the first preferred embodiment except that mixing of UHF broadcast band and VHF broadcast band is executed by mixer 131.

Integrated circuit 133 in the second preferred embodiment includes mixer 131, changeover switch 67, frequency divider 57, 66, the oscillator and changeover switch of local oscillator 56, and intermediate frequency amplifier 134 which are integrated therein. Since they are integrated, it may contribute to size reduction and performance enhancement.

(Third Preferred Embodiment)

Figure 6:
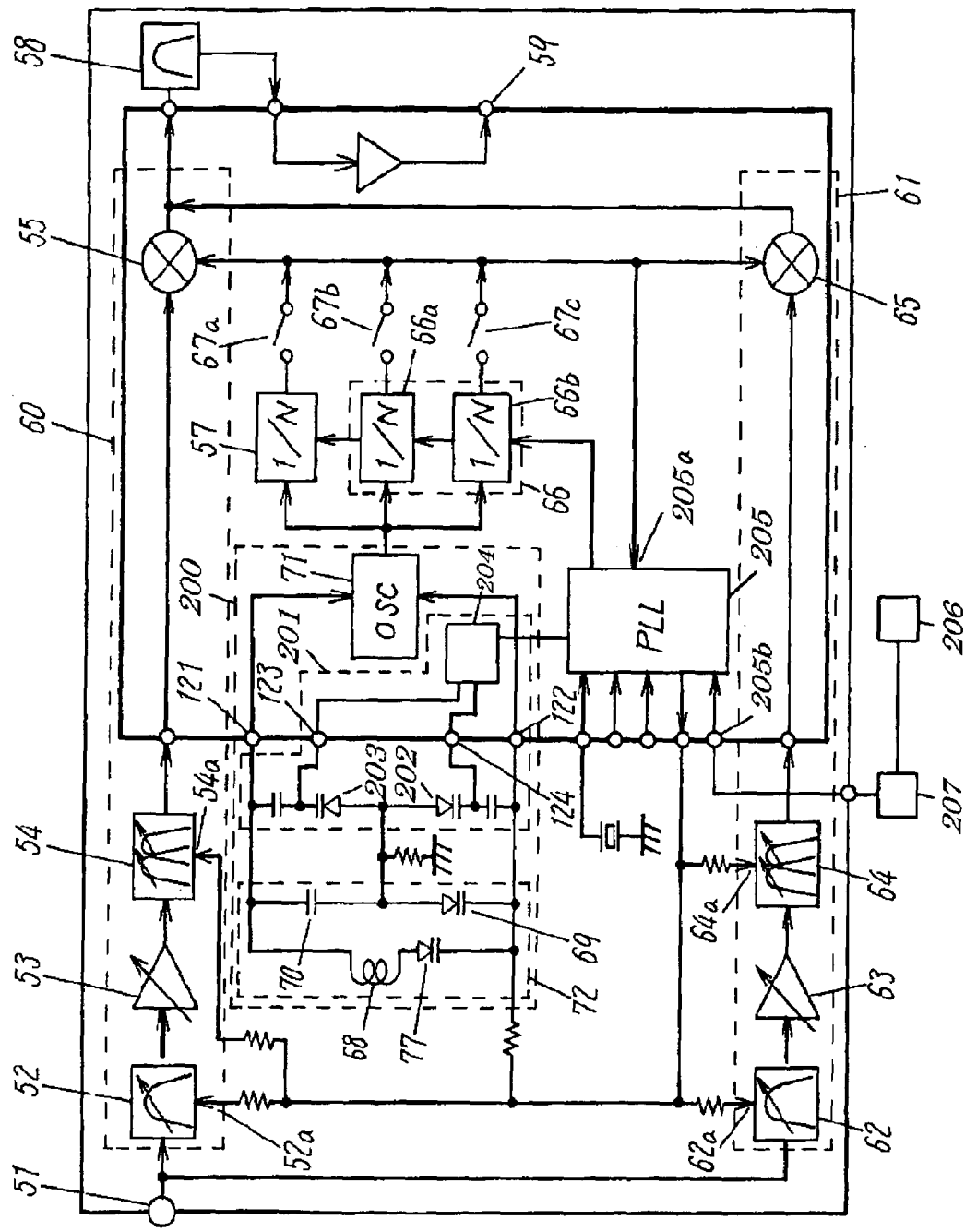
FIG. 6 is a block diagram of a high frequency receiving device in the third preferred embodiment of the present invention.

The third preferred embodiment will be described in the following with reference to the drawings. FIG. 6 is a block diagram of an essential portion of a television broadcast receiver using a high frequency receiving device in the third preferred embodiment. In the third preferred embodiment, same component elements as those in the first preferred embodiment are given same reference numerals, and the description is simplified.

In FIG. 6, single tuning filter 52 is connected to input terminal 51, and includes one variable capacity diode. Single tuning filter 52 is able to vary its tuning frequency by using the tuning voltage applied to frequency variable terminal 52a in a range from 367.25 MHz to 801.25 MHz of UHF broadcast band.

Double tuning filter 54 is connected to the output of high frequency amplifier 53. Double tuning filter 54 includes two variable capacity diodes and is able to vary its tuning frequency by using the tuning voltage applied to frequency variable terminal 54a.

The output signal of double tuning filter 54 is inputted to one side of mixer 55, and the local oscillation output signal of local oscillator 200 is inputted to the other side thereof as local oscillation signal via frequency divider 57. In mixer 55, the UHF broadcast band signal having passed through double tuning filter 54 is mixed with the frequency-divided signal of oscillation signal of local oscillator 56 or local oscillation signal, which is converted to intermediate frequency signal of 45.75 MHz.

The output of mixer 55 is connected to intermediate frequency filter 58, and unnecessary signal is attenuated by occupied band 6 MHz. The output signal of intermediate frequency filter 58 is supplied to output terminal 59 via the intermediate frequency amplifier. And these single tuning filter 52, high frequency amplifier 53, double tuning filter 54, mixer 55 and intermediate frequency filter 58 configure UHF signal receiver 60.

Also, VHF signal receiver 61 receives VHF broadcast band signal ranging from 55.25 MHz to 361.25 MHz. The VHF signal receiver 61 includes single tuning filter 62, high frequency amplifier 63, double tuning filter 64 and mixer 65 which are connected in this order.

Single tuning filter 62 is a single tuning filter including one variable capacity diode and able to vary its tuning frequency by using the tuning voltage applied frequency variable terminal 62a. The output of high frequency amplifier 63 is connected to double tuning filter 64. Double tuning filter 64 includes two variable capacity diodes and is able to vary its tuning frequency by using the tuning voltage applied to frequency variable terminal 64a.

The output signal of double tuning filter 64 is inputted to one side of mixer 65, and the local oscillation output signal of local oscillator 200 is inputted to the other side thereof as local oscillation signal via frequency divider 66. In mixer 65, the VHF broadcast band signal having passed through double tuning filter 64 is mixed with the frequency-divided signal of oscillation signal of local oscillator 56 or local oscillation signal, which is converted to intermediate frequency signal (45.75 MHz). And, the output of mixer 65 is connected to the input of intermediate frequency filter 58.

desired receiving channel inputted from channel input unit 206 is supplied to PLL circuit 205 via microcomputer 207.

Further, PLL circuit 205 supplies tuning voltage to variable capacity diodes 82, 84, 86, 89, 96, 98, 102, 107 (FIG. 2, FIG. 3) of single tuning filter 52, double tuning filter 54, single tuning filter 62 and double tuning filter 64, and to oscillation variable capacity diode 69.

Next, as for a high frequency receiving device in the third preferred embodiment, described in the following is an example of receiving TV broadcast comprising UHF broadcast band as the first frequency band and VHF broadcast band as the second frequency band continuously arranged below the UHF broadcast band.

Table 2 shows a state of each changeover switch in the case of receiving each broadcast band.

TABLE 2

| Band | Local oscillating frequency (MHz) | 202 | 203 | 67a | 67b | 67c | 95, 108, 109 | High frequency amplifier 63 | 53 |
|---|---|---|---|---|---|---|---|---|---|
| VHF-L | 101~173 | 0 V | 5 V | OFF | OFF | ON | OFF | ON | OFF |
| VHF-H | 179~407 | 5 V | 0 V | OFF | ON | OFF | ON | ON | OFF |
| UHF | 413~847 | 5 V | 5 V | ON | OFF | OFF | — | OFF | ON |

Frequency divider 66 has frequency divider 66a for receiving VHF low-band broadcast band and frequency divider 66b for receiving VHF high-band broadcast band. Also, as shown in FIG. 6, changeover switches 67a, 67b, 67c for changing over frequency dividers 57, 66a, 66b are connected between frequency divider 57, 66 and the other input of mixer 55, 65.

Next, local oscillator 200 comprises a series connection body with variable capacity diode 69 as an oscillation variable capacity diode and capacitor 70 as a first capacitor, tuner 72 having inductor 68 parallel-connected to the series connection body, oscillator 71 connected to both ends of the series connection body, and oscillation frequency changing means 201 connected between oscillator 71 and tuner 72.

And the oscillation frequency changing means 201 comprises variable capacity diode 202 as a third variable capacity diode disposed in parallel with variable capacity diode 69, variable capacity diode 203 as a third variable capacity diode disposed in parallel with capacitor 70, and control circuit 204 connected between the cathode terminal of variable capacity diode and the output of PLL circuit.

Thus, control circuit 204 serves to change the voltage applied to each of variable capacity diodes 202, 203. Accordingly, in the third preferred embodiment, the voltage applied to these variable capacity diodes 202, 203 is varied in accordance with the channel received, and thereby, the capacity value inserted in series to oscillation variable capacity diode 69 and the capacity value inserted in parallel to oscillation variable capacity diode 69 can be changed, changing the tuning frequency of the tuner, and the oscillation frequency of the local oscillator can be changed.

Also, connecting variable capacity diode 77 to inductor 68 in series fashion further enables broader band oscillation.

Local oscillation signal that is oscillation signal of local oscillator 200, frequency-divided by frequency divider 57 or 66, is supplied to input 205a of PLL circuit 205. Also, microcomputer 207 is inserted between input 205b and channel input unit 206. And, the signal that indicates the As shown in Table 2, in the case of receiving UHF broadcast band, 5V voltage is supplied to variable capacity diode 202, and 5V voltage is also supplied to variable capacity diode 203. Further, as to switch 67, switch 67a is turned ON so as to connect the output of frequency divider 57.

Next, when receiving VHF high-band broadcast band, 5V voltage is supplied to variable capacity diode 202, and 0V voltage is supplied to variable capacity diode 203. Also, as to switch 67, switch 67b is turned ON so as to connect the output of frequency divider 66a, and switches 95, 108 and 109 are turned ON.

And, when receiving VHF low-band broadcast band, 0V voltage is supplied to variable capacity diode 202, and 5V voltage is supplied to variable capacity diode 203. Also, as to switch 67, switch 67c is turned ON so as to connect the output of frequency divider 66b, and switches 95, 108 and 109 are turned OFF.

As to high frequency amplifiers 53, 63 when receiving UHF broadcast band, high frequency amplifier 53 is turned ON, and when receiving VHF broadcast band, high frequency amplifier 63 is turned ON. This is intended to achieve the purpose that when the high frequency amplifier at the non-receiving side is turned OFF, the high frequency signal having passed through single tuning filter 52 or 62 is not supplied to the other mixer 55 or 65. In this way, only the desired receiving frequency signal is converted to an intermediate frequency signal.

In the third preferred embodiment of the present invention, inductor 68 of local oscillator 200 is 8 nH, capacitor 70 is 47 pF, variable capacity diode 69 varies from 41 pF to 2.7 pF in a range from 1V to 25V, variable capacity diode 202 varies from 4 pF to 1.5 pF in a range from 0V to 5V, and variable capacity diode 203 changes from 15 pF to 1.5 pF in a range from 0V to 5V.

Local oscillator 200 thus configured oscillates a frequency ranging from 413 MHz to 847 MHz when receiving UHF broadcast band, and oscillates a frequency ranging from 358 MHz to 814 MHz when receiving VHF high-band broadcast band, and oscillates a frequency ranging from 404 MHz to 692 MHz when receiving VHF low-band broadcast band.

Further, in UHF broadcast band receiving mode, the oscillation signal of local oscillator 200 is frequency-divided to 1/1 by frequency divider 57 and supplied to mixer 55, thereby obtaining an intermediate frequency signal of 45.75 MHz. On the other hand, in VHF high-band broadcast band receiving mode, the oscillation signal of local oscillator 200 is frequency-divided to 1/2 by frequency divider 66a and supplied to mixer 65, thereby obtaining an intermediate frequency signal of 45.75 MHz. Finally, in broadcast based on NTSC system, when receiving VHF low-band broadcast band, the oscillation signal of local oscillator 200 is frequency-divided to 1/4 by frequency divider 66b and supplied to mixer 65, thereby obtaining an intermediate frequency signal of 45.75 MHz.

Through the above operation, it is possible to receive all channels of US television continuously ranging from 55.25 MHz to 801.25 MHz in a range from VHF low-band broadcast band to UHF broadcast band.

In the third preferred embodiment of the present invention, by changing the voltage supplied from control circuit 204 to each of variable capacity diodes 202, 203, the capacity value at tuner 72 of local oscillator 200 is changed in order to obtain the local oscillation frequency characteristic in relation to the tuning voltage suited for each receiving broadcast band.

Here, when 0V is supplied to variable capacity diode 202, 4 pF capacity is inserted in parallel to oscillation variable capacity diode 69. Thus, when the capacity of oscillation variable capacity diode 69 is small, the contribution level of capacity value of oscillation variable capacity diode 69 to the oscillation frequency of local oscillator 200 is lessened. Accordingly, it is possible to change the oscillation frequency in a high band of local oscillator 200 in particular where the capacity of oscillation variable capacity diode 69 becomes small.

Also, when 0V is supplied to variable capacity diode 203, 15 pF capacity is inserted in parallel to capacitor 70. Thus, since the capacity connected in series to oscillation variable capacity diode 69 changes in the direction of increasing, the changing ratio of oscillation variable capacity value becomes larger as against the oscillation frequency at local oscillator 200, and the range of oscillation frequency in relation to the tuning voltage can be changed.

In this way, the capacity values can be properly selected by supplying voltage to variable capacity diodes 202, 203 in accordance with the receiving band and receiving channel, and therefore, the respective characteristics of tuning voltage to channel (frequency) can be independently determined in each frequency band of UHF broadcast band, VHF high-band broadcast band, and VHF low-band broadcast band.

Accordingly, by properly changing the capacity values of these variable capacity diodes 202, 203, the tuning voltage characteristic in relation to the receiving channel (frequency) of local oscillator 56 in each band can be approximated to the tuning voltage characteristic in relation to the receiving channel (frequency) of single tuning filter 52, 62 and double tuning filter 54, 64.

And in accordance with the instruction from microcomputer 207, control circuit 204 controls the voltage supplied to variable capacity diodes 202, 203 according to the frequency band received, and thereby, it is possible to receive all channels of US television continuously ranging from 55.25 MHz to 801.25 MHz in a range from VHF broadcast band to UHF broadcast band.

As described above, by properly changing the capacity values of variable capacity diodes 202, 203 of the oscillation frequency changing means, it is possible to change the contribution level to the oscillation frequency characteristics of oscillation variable capacity diode the same as in the first preferred embodiment, and therefore, the oscillation frequency characteristics can be flexibly corrected, and it is possible to approximate the oscillation frequency characteristic at local oscillator 56 to each tuning filter and to set the oscillation frequency range suited for each broadcast band.

Also, in the third preferred embodiment, oscillator 71, frequency dividers 57, 66, mixers 55, 65, PLL circuit 78 and control circuit 76 are integrated in one package, forming an integrated circuit. Thus, the high frequency receiving device can be reduced in size.

Further, the integrated circuit has terminals 121, 122 for connecting both ends of inductor 68, and terminals 123, 124 for connecting to each cathode terminal of variable capacity diodes 74, 75. And, between terminals 121 and 122 are arranged terminals 123, 124. Thus, parts such as variable capacity diode 69, inductor 68, capacitor 70, variable capacity diode 74, 75 of the tuner can be connected to terminals 121, 122, 123, 124 of the integrated circuit by shortest wiring, and it is possible to make high-quality design by reducing unnecessary capacity components and inductor components.

(Fourth Preferred Embodiment)

In the fourth preferred embodiment, UHF broadcast band and VHF broadcast band are received by using only one mixer. Accordingly, it contributes to the reduction of size and cost. The fourth preferred embodiment will be described in the following. Incidentally, those same as in the second preferred embodiment are given same reference numerals, and the description is simplified.

Figure 7:
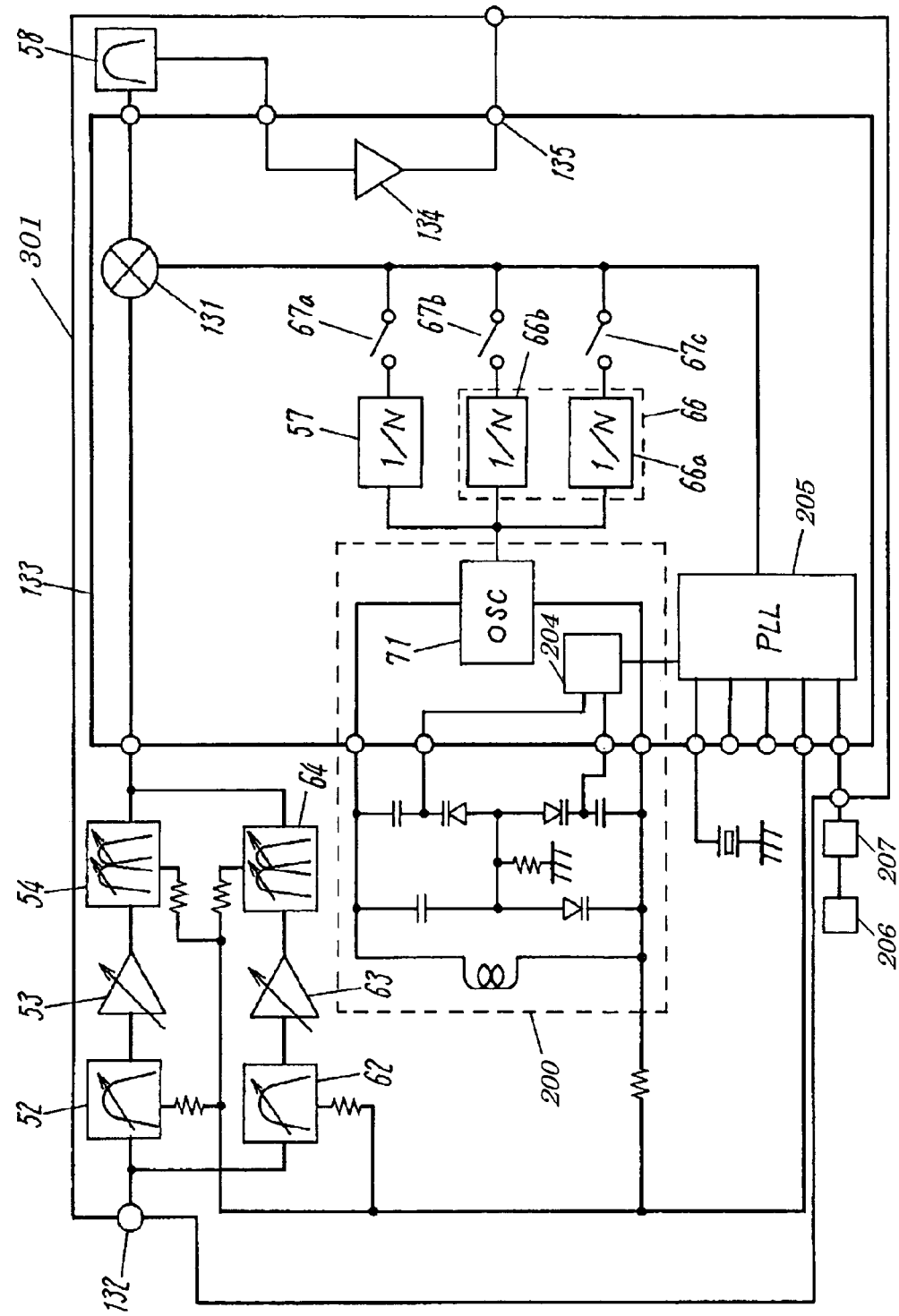
FIG. 7 is a block diagram of a high frequency receiving device in the fourth preferred embodiment of the present invention.
Figure 8:
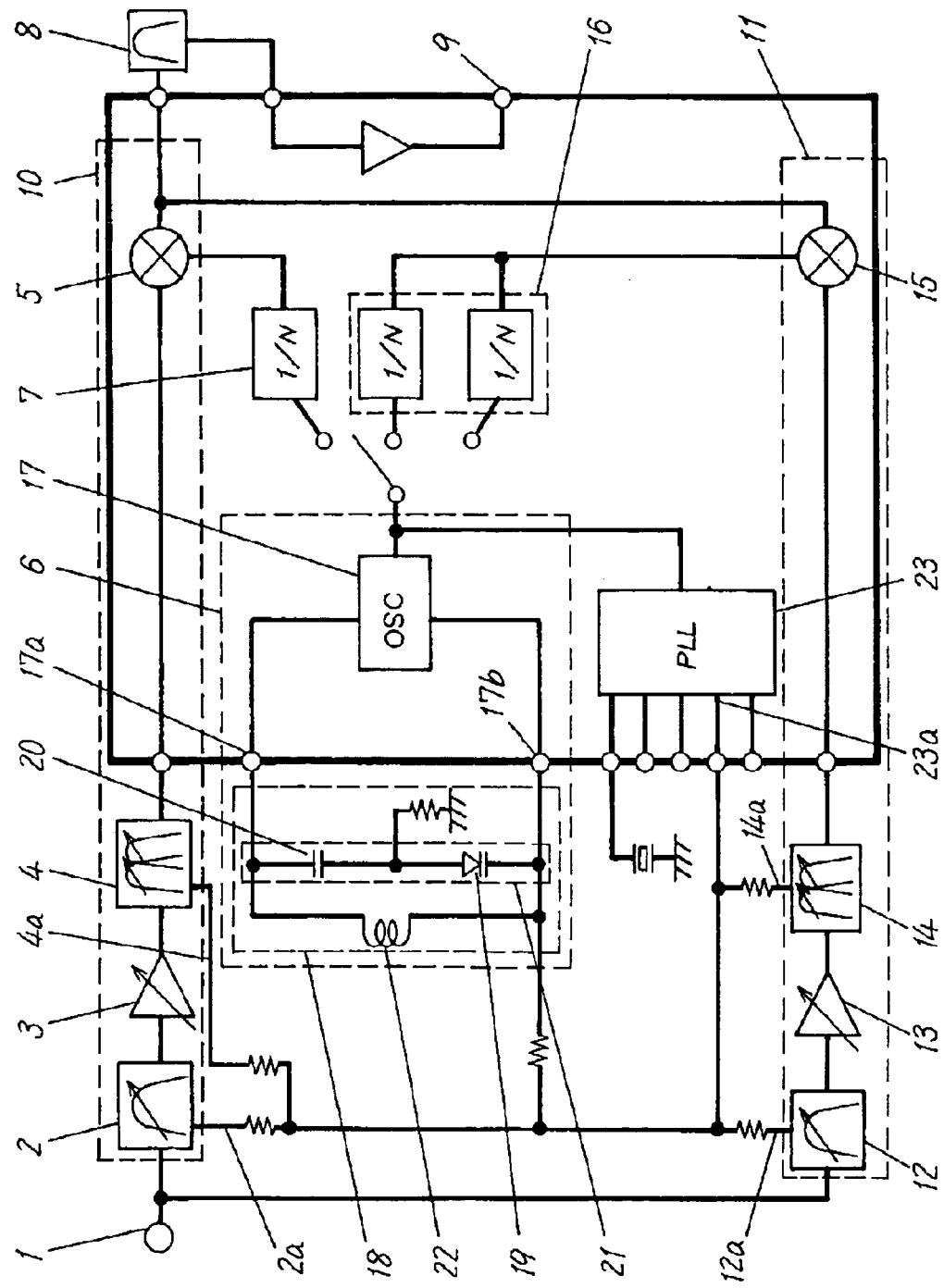
FIG. 8 is a block diagram of a conventional high frequency receiving device.
Figure 9:
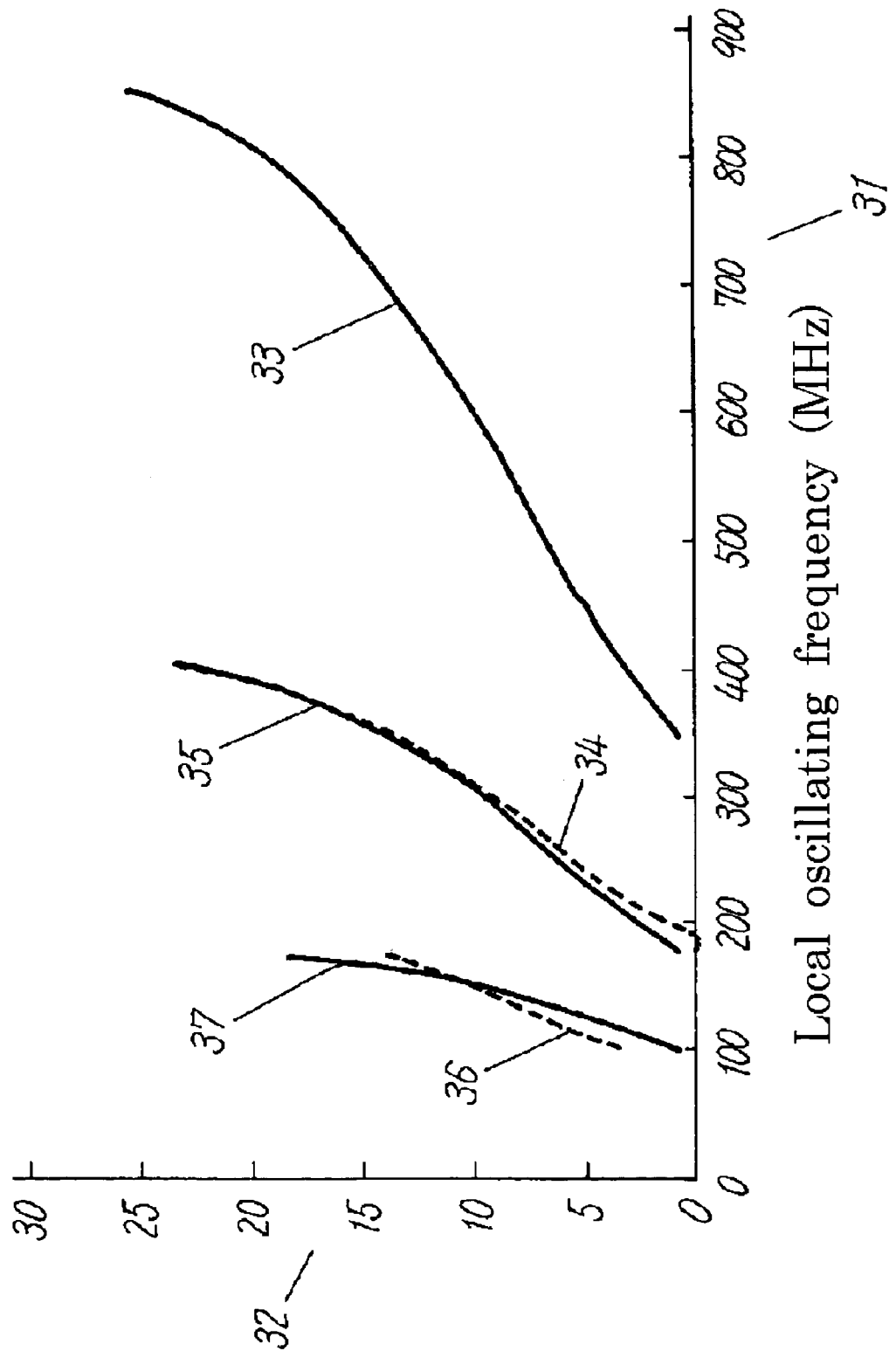
FIG. 9 is a characteristic diagram of a conventional tuning voltage in relation to local oscillation signal applied to a mixer thereof.

FIG. 7 is a block diagram of a high frequency receiving device in the fourth preferred embodiment. In FIG. 7, to input terminal 132 are connected in parallel fashion, for UHF broadcast band passing, the first series connection body with single tuning filter 52, high frequency amplifier 53, and double tuning filter 54 connected in this order, and for VHF broadcast band passing, the second series connection body with single tuning filter 62, high frequency amplifier 63, and double tuning filter 64 connected in this order.

And, the output of the parallel connection body with the series connection bodies connected in parallel fashion is connected to one input of mixer 131 installed in integrated circuit 133. The output of mixer 131 is connected to output terminal 135 via intermediate frequency filter 58 and intermediate frequency amplifier 134.

On the other hand, to the other input of mixer 131 is connected the output of changeover switch 67. Also, the output of changeover switch 67 is connected to PLL circuit 78. In UHF broadcast band receiving mode, frequency divider 57 can be omitted. That is, the frequency ratio can be set to 1.

Also, by using only the second series connection body for VHF broadcast band passing, it is possible to realize a high frequency receiving device for VHF broadcast band only, omitting the first series connection body for UHF broadcast band passing.

The operation of the high frequency receiving device in the fourth preferred embodiment is same as in the third preferred embodiment except that mixing of UHF broadcast band and VHF broadcast band is executed by mixer 131. Also, integrated circuit 133 in the fourth preferred embodiment includes mixer 131, changeover switch 67, frequency divider 57, 66, oscillator 71 of local oscillator 200, control circuit 204 and intermediate frequency amplifier 134, which are integrated therein. Since they are integrated, it may contribute to size reduction and performance enhancement.

What is claimed is:

1. A high frequency receiving device wherein high frequency signals of a first frequency band and of a second frequency band lower than the first frequency band are inputted, and a desired receiving channel signal is extracted from the high frequency signal by an amplifier including a tuning circuit, and the extracted signal is mixed with a local oscillation signal produced by using a local oscillation output signal outputted from a local oscillator, thereby converting the signal into an intermediate frequency signal that is a constant frequency to be outputted, comprising:

an amplifier for extracting a desired receiving channel signal by selecting a frequency according to supplied tuning voltage out of the high frequency signal input;

a local oscillator for producing a local oscillation output signal of a frequency according to the tuning voltage supplied;

a local oscillation selector wherein the local oscillation output signal is inputted, and the local oscillation signal whose frequency is divided by a predetermined dividing ratio with respect to the frequency of the local oscillation output signal is outputted;

a mixer which mixes a signal from the amplifier with the local oscillation signal from the local oscillation selector, and outputs an intermediate frequency signal that is a predetermined intermediate frequency; and a PLL circuit wherein the local oscillation signal is inputted, and the tuning voltage according to the frequency of the local oscillation signal is produced, and the tuning voltage is supplied to the amplifier and the local oscillator, wherein the local oscillator has an oscillation frequency changing means which changes the oscillation frequency characteristic of the local oscillation output signal in relation to the tuning voltage in accordance with the first frequency band or the second frequency band.

2. A high frequency receiving device, comprising:

an input terminal for inputting high frequency signals of a first frequency band and of a second frequency band lower than the first frequency band;

a first receiver including a first tuning filter which varies in tuning frequency according to change in capacity of a first variable capacity diode for passing a high frequency signal of the first frequency band out of signals supplied to the input terminal, and a first mixer wherein output of the first tuning filter is inputted to one side thereof and the output is supplied to an output terminal;

a second receiver including a second tuning filter which varies in tuning frequency according to change in capacity of a second variable capacity diode for passing a high frequency signal of the second frequency band out of signals supplied to the input terminal, and a second mixer wherein output of the second tuning filter is inputted to one side thereof and the output is supplied to the output terminal;

one local oscillator for producing a local oscillation output signal for supplying a local oscillation signal to each of the other inputs of the first mixer and the second mixer, and at least one frequency divider; and a PLL circuit which executes tuning control of the local oscillator, the first and the second tuning filters to a receiving channel with the local oscillation signal supplied, wherein the local oscillator has an oscillator, and a tuner connected to the oscillator, and an oscillation frequency changing means inserted between the tuner and the oscillator;

the tuner has a series connection body with an oscillation variable capacity diode and a first capacitor, and an inductor parallel-connected to the series connection body; and the PLL circuit supplies a tuning voltage to the first variable capacity diode, the second variable capacity diode, and the oscillation variable capacity diode, and the oscillation frequency changing means, in each frequency band received, slightly changes the oscillation frequency characteristic of the local oscillator in relation to the tuning voltage supplied from the PLL circuit, which operates in accordance with frequency characteristic of the first tuning filter when receiving the first frequency band, and operates in accordance with frequency characteristic of the second tuning filter when receiving the second frequency band, thereby obtaining an oscillation signal varied just by a predetermined frequency.

3. The high frequency receiving device of claim 2, wherein the oscillation frequency changing means includes a capacitor capable of selectively changing over parallel connection/non-connection to the oscillation variable capacity diode and a capacitor capable of selectively changing over parallel connection/non-connection to the first capacitor, and selectively connects the respective capacitors in parallel fashion according to a frequency band received.

4. The high frequency receiving device of claim 3, wherein the capacitor capable of selectively changing over parallel connection/non-connection to the first capacitor uses a changeover means for making parallel connection/non-connection according to a frequency band received in order to make parallel connection changeover.

5. The high frequency receiving device of claim 4, wherein the capacitor capable of selectively changing over parallel connection to the first capacitor comprises a plurality of capacitors, and the changeover means selects a capacitor to be parallel-connected out of the plurality of capacitors according to a frequency band received in order to make parallel connection of the selected capacitor.

6. The high frequency receiving device of claim 3, wherein the capacitor capable of selectively changing over parallel connection to the oscillation variable capacity diode comprises a plurality of capacitors, and a capacitor selected out of the plurality of capacitors is parallel-connected according to a frequency band received.

7. The high frequency receiving device of claim 2, wherein a third variable capacity diode is disposed in series to an inductor.

8. The high frequency receiving device of claim 2, wherein the first frequency band is UHF broadcast band, and the second frequency band is VHF broadcast band.

9. The high frequency receiving device of claim 8, wherein frequency ratio of a frequency divider is set to 1 when receiving UHF broadcast signal, and to 1/2 or less when receiving VHF broadcast band signal.

10. The high frequency receiving device of claim 9, wherein when receiving VHF high-band, the frequency ratio is set to 1/2, and the oscillation frequency of local oscillator is set to a range from about 360 MHz to about 900 MHz.

11. The high frequency receiving device of claim 10, wherein the frequency ratio is set to 1/4 when receiving VHF low-band.

12. The high frequency receiving device of claim 10, wherein the frequency ratio is set to 1/5 when receiving VHF low-band.

13. The high frequency receiving device of claim 8, wherein when receiving the second frequency band signal, frequency-divided signal outputted from the frequency divider is supplied to the PLL circuit.

14. The high frequency receiving device of claim 2, wherein the first variable capacity diode, the second variable capacity diode, and the oscillation variable capacity diode are nearly equal to each other in capacity change characteristic.

15. The high frequency receiving device of claim 14, wherein the value of capacity change ratio of the first variable capacity diode, the second variable capacity diode, and the oscillation variable capacity diode is nearly equal to the value of capacity change ratio necessary for a frequency band being largest in bandwidth within a frequency band received.

16. The high frequency receiving device of claim 2, wherein the oscillation frequency changing means comprises a third variable capacity diode parallel-connected to the oscillation variable capacity diode, a second capacitor inserted between the cathode terminal of the third variable capacity diode and the oscillation variable capacity diode, and a control circuit connected to the cathode terminal, and the control circuit supplies different levels of voltage to the third variable capacity diode in accordance with a frequency band received.

17. The high frequency receiving device of claim 2, wherein the oscillation frequency changing means comprises a third variable capacity diode parallel-connected to the first capacitor, a third capacitor inserted between the cathode terminal of the third variable capacity diode and the first capacitor, and a control circuit connected to the cathode terminal, and the control circuit supplies different levels of voltage to the third variable capacity diode in accordance with a frequency band received.

18. In a high frequency receiving device which receives a high frequency signal, dividing the signal into at least a first frequency band and a second frequency band lower than the first frequency band,
the high frequency receiving device comprises:
an input terminal;
a tuning filter which is supplied with the high frequency signal inputted to the input terminal, and also varies in tuning frequency in accordance with change in capacity of a variable capacity diode;
a local oscillator for producing a local oscillation output signal;
a mixer wherein output of the tuning filter is supplied to one input thereof, and local oscillation signal is supplied to the other input, converting a first signal within the first frequency band to an intermediate frequency signal;
an output terminal to which output of the mixer is supplied;
a frequency divider disposed between the local oscillator and the mixer for converting a signal within the second frequency band to an intermediate frequency signal when receiving a second signal within the second frequency band;
a changeover switch for selectively supplying any one of outputs of the frequency divider and the local oscillator to the mixer as the local oscillation signal according to a frequency band received; and
a PLL circuit which executes tuning control of the local oscillator and the tuning filter to receiving channel,
wherein the local oscillator includes an oscillator, a tuner connected to the oscillator, and an oscillation frequency changing means inserted between the tuner and the oscillator;
the tuner includes a series connection body with an oscillation variable capacity diode and a first capacitor, and an inductor parallel-connected to the series connection body;
the PLL circuit supplies a tuning voltage to the variable capacity diode and the oscillation variable capacity diode; and
the oscillation frequency changing means, in each frequency band received, slightly changes oscillation frequency characteristic of the local oscillator in relation to tuning voltage supplied from the PLL circuit, and operates in accordance with frequency characteristic of the tuning filter to obtain an oscillation signal varied just by a predetermined frequency.

19. In a high frequency receiving device which receives a high frequency signal, dividing the signal into at least a first frequency band and a second frequency band lower than the first frequency band,
the high frequency receiving device comprises:
an input terminal;
a tuning filter which is supplied with the high frequency signal inputted to the input terminal, and also varies in tuning frequency in accordance with change in capacity of a variable capacity diode;
a mixer wherein output of the tuning filter is supplied to one input thereof, and output of a frequency divider whose frequency dividing ratio is varied according to a frequency band received is connected to the other input as local oscillation signal;
an output terminal to which output of the mixer is supplied;
a local oscillator connected to input of the frequency divider; and
a PLL circuit to which output signal of the frequency divider is supplied;
wherein the local oscillator includes an oscillator, a tuner connected to the oscillator, and an oscillation frequency changing means inserted between the tuner and the oscillator;
the tuner includes a series connection body with an oscillation variable capacity diode and a first capacitor, and an inductor parallel-connected to the series connection body;
the PLL circuit is supplied with the local oscillation signal, and also supplies a tuning voltage to the variable capacity diode and the oscillation variable capacity diode; and
the oscillation frequency changing means, in each frequency band received, slightly changes oscillation frequency characteristic of the local oscillator in relation to tuning voltage supplied from the PLL circuit, and operates in accordance with frequency characteristic of the tuning filter to obtain a frequency divider output varied just by a predetermined frequency.

20. The high frequency receiving device of claim 19, wherein the oscillation frequency changing means includes a capacitor capable of selectively changing over parallel connection/non-connection to the oscillation variable capacity diode and a capacitor capable of selectively changing over parallel connection/non-connection to the first capacitor, and selectively connects the respective capacitors in parallel fashion according to a frequency band received.

21. The high frequency receiving device of claim 19, wherein the frequency divider comprises a plurality of frequency dividers, and a changeover switch for selectively changing over the local oscillation signal inputted to a mixer according to a frequency band received is connected to the plurality of frequency dividers.

22. The high frequency receiving device of claim 19, wherein the first frequency band is UHF broadcast band, and the second frequency band is VHF broadcast band.

23. The high frequency receiving device of claim 19, wherein the frequency dividing ratio of the frequency divider is set to 1 when receiving a signal of the first frequency band, and to 1/2 or less when receiving a signal of the second frequency band.

24. The high frequency receiving device of claim 19, wherein the first frequency band is VHF high-band broadcast band, and the second frequency band is VHF low-band broadcast band.

25. The high frequency receiving device of claim 19, wherein the frequency dividing ratio of the frequency divider is set to 1/2 or less when receiving a signal of the first frequency band, and to a ratio higher than the frequency dividing ratio for receiving a signal of the first frequency band when receiving a signal of the second frequency band.

26. The high frequency receiving device of claim 24, wherein the frequency dividing ratio of the frequency divider is set to 1/2 when receiving a signal of VHF high-band broadcast band, and to 1/4 when receiving a signal of VHF low-band broadcast band.

27. The high frequency receiving device of claim 24, wherein the frequency dividing ratio of the frequency divider is set to 1/2 when receiving a signal of VHF high-band broadcast band, and to 1/5 when receiving a signal of VHF low-band broadcast band.

28. The high frequency receiving device of claim 19, wherein the frequency divider comprises a first stationary frequency divider which divides the output frequency of the local oscillator into 1/2, a second stationary frequency divider which further divides the output signal of the first stationary frequency divider into 1/2, and a changeover switch which changes over the output signal of the first stationary frequency divider and the output signal of the second stationary frequency divider to supply the signal to the other terminal of the mixer.

29. The high frequency receiving device of claim 19, wherein the tuning filter comprises a first tuning filter tuned to a frequency within the first frequency band, and a second tuning filter disposed in parallel with the first tuning filter and tuned to a frequency within the second frequency band.

30. The high frequency receiving device of claim 19, wherein the oscillation frequency changing means comprises a third variable capacity diode parallel-connected to the first capacitor, a third capacitor inserted between the cathode terminal of the third variable capacity diode and the first capacitor, and a control circuit connected to the cathode terminal, and the control circuit supplies different levels of voltage to the third variable capacity diode in accordance with a frequency band received.

31. The high frequency receiving device of claim 19, wherein the oscillation frequency changing means comprises a third variable capacity diode parallel-connected to an oscillation variable capacity diode, a second capacitor inserted between the cathode terminal of the third variable capacity diode and the oscillation variable capacity diode, and a control circuit connected to the cathode terminal, and the control circuit supplies different levels of voltage to the third variable capacity diode in accordance with a frequency band received.

32. An integrated circuit wherein a first mixer, second mixer, PLL circuit, oscillator, frequency divider, and oscillation frequency changing means are integrated to configure a high frequency receiving device of claim 2.

33. An integrated circuit wherein a first mixer, second mixer, PLL circuit, oscillator, frequency divider, and capacity changing means are integrated to configure a high frequency receiving device of claim 3.

34. An integrated circuit wherein a first mixer, second mixer, PLL circuit, oscillator, frequency divider, and changeover means are integrated to configure a high frequency receiving device of claim 4.

35. An integrated circuit wherein a first mixer, second mixer, PLL circuit, oscillator, frequency divider, and changeover means are integrated to configure a high frequency receiving device of claim 5.

36. An integrated circuit comprising a PLL circuit, oscillator, frequency divider, and changeover means which are at least integrated therein to configure a high frequency receiving device of claim 4 or claim 6, wherein a connecting terminal for connecting the oscillator to a tuner in the integrated circuit is arranged such that between a series connection body with an oscillation variable capacity diode and a first capacitor and a connector terminal to which both ends of an inductor parallel-connected to the series connection body is disposed a connecting terminal for connecting a capacitor which is able to make the parallel connection.

37. An integrated circuit wherein a first mixer, second mixer, PLL circuit, oscillator, frequency divider, and control circuit are integrated to configure a high frequency receiving device of claim 16.

38. An integrated circuit wherein a first mixer, second mixer, PLL circuit, oscillator, frequency divider, and control circuit are integrated to configure a high frequency receiving device of claim 17.

39. An integrated circuit wherein a mixer, PLL circuit, oscillator, and frequency divider are at least integrated to configure a high frequency receiving device of claim 18.

40. An integrated circuit wherein a mixer, PLL circuit, oscillator, and frequency divider are at least integrated to configure a high frequency receiving device of claim 19.

41. An integrated circuit wherein a mixer, PLL circuit, oscillator, frequency divider, and capacity changing means are at least integrated to configure a high frequency receiving device of claim 20.

42. A TV broadcast receiver comprising a microcomputer connected to an input of PLL circuit and an input of control circuit in a high frequency receiving device of claim 2, to which a channel selecting signal showing a desired receiving channel is inputted by an operator, wherein the microcomputer instructs the PLL circuit to supply a tuning voltage according to the channel selecting signal and the control circuit to supply a voltage according to the channel selecting signal.

43. A TV broadcast receiver comprising a microcomputer connected to an input of PLL circuit and an input of control circuit in a high frequency receiving device of claim 16 or 17, to which a channel selecting signal showing a desired receiving channel is inputted by an operator, wherein the microcomputer instructs the PLL circuit to supply a tuning voltage according to the channel selecting signal and the control circuit to supply a voltage according to the channel selecting signal.

* * * * *